(12) United States Patent
Sibert

(10) Patent No.: US 8,402,282 B2
(45) Date of Patent: Mar. 19, 2013

(54) METHOD AND DEVICE FOR ENCRYPTING AND DECRYPTING DIGITAL DATA

(75) Inventor: Hervé Sibert, Le Mans (FR)

(73) Assignee: ST-Ericsson SA, Plan-les-Ouates (CH)

( * ) Notice: Subject to any disclaimer, the term of this patent is extended or adjusted under 35 U.S.C. 154(b) by 51 days.

(21) Appl. No.: 13/154,083

(22) Filed: Jun. 6, 2011

(65) Prior Publication Data

US 2011/0296200 A1  Dec. 1, 2011

Related U.S. Application Data

(63) Continuation of application No. PCT/EP2009/065843, filed on Nov. 25, 2009.

(30) Foreign Application Priority Data

Dec. 8, 2008 (FR) ...................................... 08 58348

(51) Int. Cl.
*H04L 29/06* (2006.01)
(52) U.S. Cl. ...................................................... 713/189
(58) Field of Classification Search .................... 713/189
See application file for complete search history.

(56) References Cited

U.S. PATENT DOCUMENTS

| | | | | |
|---|---|---|---|---|
| 7,925,012 B2 * | 4/2011 | Lecomte et al. | ................. | 380/42 |
| 7,965,841 B2 * | 6/2011 | Itani | .............................. | 380/217 |
| 2003/0093643 A1 * | 5/2003 | Britt, Jr. | ......................... | 711/170 |
| 2004/0076299 A1 * | 4/2004 | Wang | ............................. | 380/269 |
| 2004/0264698 A1 * | 12/2004 | Oda | ............................... | 380/269 |
| 2010/0017578 A1 * | 1/2010 | Mansson et al. | .............. | 711/171 |

FOREIGN PATENT DOCUMENTS

EP  1107504 A1  6/2001

OTHER PUBLICATIONS

International Search Report for PCT/EP2009/065843 mailed Jan. 20, 2010.
Ziv, J., et al., "A Universal Algorithm for Sequential Data Compression," IEEE Transactions on Information Theory, IEEE, US, vol. 23, No. 3, May 1, 1977, pp. 337-343, XP000560510.
Welch, T., "A Technique for High-Performance Data Compression," Computer, IEEE Service Center, US, Jun. 1, 1984, pp. 8-19; XP000673349.

* cited by examiner

*Primary Examiner* — Michael S McNally
(74) *Attorney, Agent, or Firm* — Potomac Patent Group PLLC

(57) ABSTRACT

Method for encrypting an initial digital data set, which comprises a compression of the initial digital data set delivering a compressed set comprising at least one compressed digital data stream and at least one dictionary making it possible to describe the content of the compressed digital data stream or streams, and an encryption of each dictionary only delivering an encrypted digital data set.

11 Claims, 5 Drawing Sheets

METHOD AND DEVICE FOR ENCRYPTING AND DECRYPTING DIGITAL DATA

The invention relates to the processing of digital data, in particular the encryption and the decryption of these digital data.

The invention applies advantageously but not limitingly to paginated data, used especially in a virtual memory mechanism, for example within a wireless communication apparatus, such as a cellular mobile telephone.

Currently, digital data relating especially to video, music, images or text are embedded in electronic systems such as computers, GPS (Global Positioning System) navigation systems, and especially telephone systems.

These digital data may be system data, confidential manufacturer data or personal user data and therefore need to be protected. For this purpose, certain systems encrypt the data to be protected with the aid of encryption algorithms that are more or less complex depending on the data types.

Furthermore, these data are generally saved in memory and, depending on their type, they may occupy a large memory space. This is why data compression tools, for example, are used to increase the capacity of the memory so as to save more digital data.

Most systems encrypt and compress the digital data so as to meet the various needs mentioned above. For example, the systems use a method which consists in decrypting the digital data initially, and then in decompressing the data thus decrypted subsequently, before being able to use the data. But this method is lengthy since it requires that the whole of the data be analysed twice, once to apply an algorithm for decrypting the data, and a second time to apply an algorithm for decompressing the decrypted data.

Moreover, certain digital data are saved in storage memories, that is to say memories which retain the recorded data when the system is no longer powered up. These data are in general contained in memory pages; the memory is then said to be paginated. These data can be parts of executable code which are used by the system, either during booting, or during normal operation of the system. It is therefore important to be able to use these data as rapidly as possible so as to decrease the system boot time, but also to decrease the time required to load the pages into another area of the memory which is utilizable during normal operation of the system, for example a work memory. The time required to load the pages in order to use the data is also referred to as the pagination time. The booting and pagination times are all the longer the more the data are encrypted and/or compressed.

According to modes of implementation and embodiments, there is proposed a method and a device making it possible to decrease the boot time and the pagination time of a system which uses data which are compressed and/or encrypted.

According to one aspect, there is therefore proposed a method for encrypting an initial digital data set.

According to a general characteristic of this aspect, the method comprises a compression of the initial digital data set delivering a compressed set comprising at least one compressed digital data stream and at least one dictionary making it possible to describe the content of the compressed digital data stream or streams, and an encryption of each dictionary only delivering an encrypted digital data set.

Thus only part of the data is encrypted so as to make it possible to decrease the booting and pagination times during data accesses. The data are also compressed so as to decrease the space occupied by these data in the memory areas of the system.

The compressed set can comprise a dictionary associated with several compressed digital data streams or several dictionaries respectively associated with several compressed digital data streams.

The rate of compression of the digital data when the dictionaries are respectively associated with a single compressed data stream is improved. By obtaining a better compression rate, the pagination time and the time required to boot the system are improved. Indeed, during the decompression steps it is necessary to traverse the compressed digital data streams to perform the decompression of the said data and this traversal time will be all the shorter the smaller the size of the streams.

The initial digital data set can be a paginated data set and the encrypted digital data set is advantageously stored, furthermore, in a paginated storage memory of an electronic system, for example a wireless communication apparatus.

Such a mode of implementation is particularly suited to electronic systems, especially to wireless communication apparatuses which use paginated memories to store their digital data.

According to another aspect, there is proposed a method for decrypting a digital data set encrypted by the encryption method defined above on the basis of an initial digital data set.

According to a general characteristic of this other aspect, the method comprises a decryption of the dictionary or dictionaries and a decompression of the compressed digital data stream or streams with the aid of the decrypted dictionary or dictionaries so as to obtain the initial digital data set.

The fact of not encrypting compressed data and of encrypting only a dictionary which comprises uncompressed data makes it possible in particular to separate the decryption and decompression actions during access to the data associated with the dictionary.

Indeed, two actions are not performed simultaneously, or successively, on the same data. That is to say, an action of decrypting the dictionary is performed, followed by an action of decompressing the data which are not situated in the dictionary. The system booting and pagination time is thus decreased.

According to one mode of implementation, the method comprises a storage of the encrypted digital data set in a paginated storage memory of an electronic system and a decryption of the dictionary or dictionaries during the booting of the electronic system.

Advantageously, the dictionary or dictionaries is or are decrypted only on booting the electronic system. The fact of performing a decryption action only on booting makes it possible to avoid decrypting data in the course of the normal operation of the system, and therefore to decrease the pagination time. Furthermore, this also makes it possible to decrease the boot time since the single decryption action is performed only on a reduced part of the data.

Moreover, when there is a data access error during the normal operation of the system, it is possible to repeat the access to the compressed data without having to perform a decryption action, thereby accelerating the processing of the data access errors.

According to a further mode of implementation, in which the electronic system comprises a virtual memory mechanism comprising a paginated work memory, the content of memory pages is transferred from the paginated storage memory to the paginated work memory and the encrypted digital data set contained in the memory pages is decompressed during the transfers of memory pages.

The method can be implemented in a wireless communication apparatus.

According to yet another aspect, there is proposed a device for decrypting a digital data set encrypted on the basis of an initial digital data set.

According to a general characteristic of this other aspect, the encrypted digital data set comprises at least one unencrypted compressed digital data stream and at least one encrypted dictionary making it possible to describe the content of the compressed digital data stream or streams and the device comprises a decryption means able to decrypt the dictionary or dictionaries and a decompression means able to decompress the compressed digital data stream or streams with the aid of the decrypted dictionary or dictionaries so as to obtain the initial digital data set.

According to one embodiment, a paginated storage memory of an electronic system contains the encrypted digital data set and the decryption means is able to decrypt the dictionary or dictionaries during the booting of the electronic system.

According to a further embodiment, the electronic system comprises a virtual memory mechanism comprising a paginated work memory and a memory management unit which is able to transfer the content of memory pages from the paginated storage memory to the paginated work memory and in which the decompression means is able to decompress the encrypted digital data set contained in the memory pages during the transfers of memory pages.

According to yet another aspect, there is proposed a wireless communication apparatus comprising a decryption device as defined previously.

Other advantages and characteristics will be apparent on examining the detailed description of wholly non-limiting modes of implementation and embodiments of the invention, and the appended drawings in which.

Figure 1:
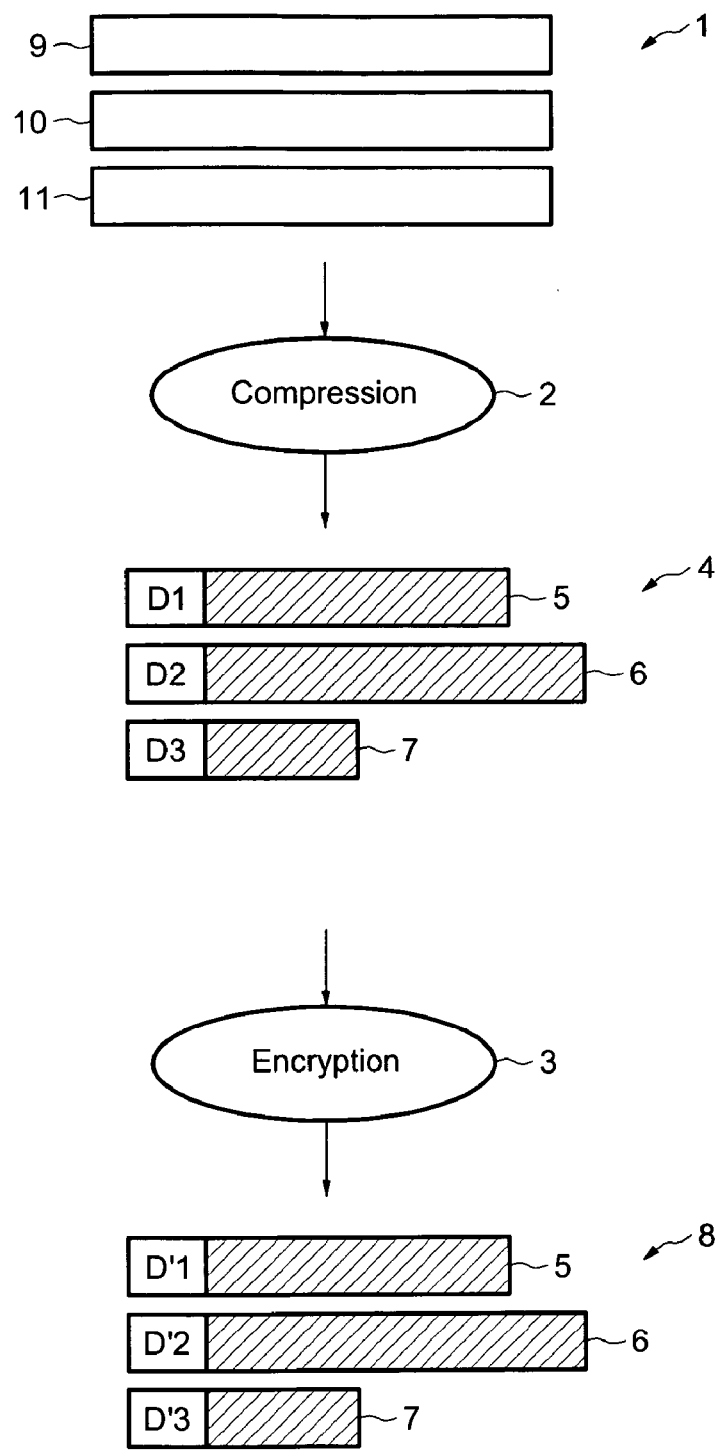
FIG. 1 represents a flowchart illustrating the main phases of a mode of implementation of the method for encrypting digital data.

In FIG. 1 are represented the main phases of a method for encrypting a digital data set 1. The method comprises a compression step 2 and an encryption step 3.

During the compression step 2 a compressed set 4 is formulated on the basis of the digital data set 1. The compressed set 4 comprises a plurality of dictionaries D1 to D3 and a plurality of compressed digital data streams 5 to 7. Next, an encryption step 3 is performed in which only the dictionaries D1 to D3 are encrypted so as to obtain an encrypted digital data set 8. This encrypted digital data set 8 comprises the said compressed digital data streams 5 to 7 and the said encrypted dictionaries D'1 to D'3.

Compression algorithms using dictionaries are well known to the person skilled in the art. It is possible to cite, for example, the compression algorithms DEFLATE (used in the ZIP® compression format), LZW (Lempel-Ziv-Welch), or LZO (Lempel-Ziv-Oberhumer) which use a dictionary to compress the data without losses.

Moreover, for the encryption it is possible to use for example the AES (Advanced Encryption Standard) algorithm, or indeed the DES (Data Encryption Standard) algorithm.

During the compression step 2, digital data patterns which are repeated with varied frequencies are identified within the initial digital data set 4. That is to say that one and the same pattern may appear several times in the digital data 1.

Each dictionary D1 to D3 comprises a plurality of mutually distinct digital data patterns and a plurality of identifiers. Each identifier of a dictionary D1 to D3 is coupled to a single digital data pattern. Next, during the compression step 2, a list of distinct digital data patterns coupled respectively to the identifiers is identified. A part of the compression step 2 consists in replacing in the digital data 1 each repeated pattern with its unique identifier. Thus several compressed digital data streams 5 to 7 containing series of identifiers are created. It is also possible to replace in the digital data 1 a pattern with its identifier, or with a reference address. The scheme which replaces a pattern with a reference address consists in replacing the pattern with its identifier the first time that the said pattern is encountered in the digital data 1. Next, instead of replacing the succeeding repeated patterns with the identifier, it is possible to replace them with an address referencing the address of the identifier in the compressed data stream.

Advantageously, an identifier having a size as a function of the frequency of repetition of a pattern will be chosen. To improve the compression rate, it will be chosen to couple a pattern to an identifier having a size that is all the smaller the higher the frequency of the pattern.

In order to improve the choice of identifiers, to obtain a better compression rate, it is possible to construct a prefix code, for example a Huffman code, such that the shortest words of this code represent the most frequent patterns. These patterns can be, for example in the case of a text, a letter of the alphabet represented by its 8-bit length ASCII (American Standard Code for Information Interchange) code, each letter being coupled in the Huffman code to a binary word that is all the shorter the more frequently the letter appears in the text. It is possible to add other patterns such as sequences of letters by coupling them through binary identifiers that are shorter still available in the Huffman code under construction. The Huffman code resulting from this process is included in the said compressed digital data set and constitutes the dictionary. Though the Huffman code is the most common scheme for constructing the dictionary, other schemes exist. Generally, the set of information contained in the compressed digital data set which establishes a correspondence between binary words of the compressed digital data stream, or identifiers, and binary words of the initial uncompressed digital data set, or patterns, is called a "dictionary".

Moreover, the digital data 1 can be grouped together in distinct partitions 9 to 11 of an electronic system. In this case, the digital data of each partition are then compressed so as to obtain compressed data streams respectively associated with the partitions.

It will therefore be possible, in one mode of implementation of the encryption method, to formulate several dictionaries D1 to D3 associated respectively with several digital data streams 5 to 7. In this case, each dictionary D1 to D3 is associated respectively with the partitions 9 to 11. In this case the dictionaries D1 to D3 are different from one another since they contain different identifiers depending on the various data contained in the partitions 9 to 11. By virtue of such a mode of implementation, the data compression rate is optimized with the aid of dictionaries D1 to D3 suited to the various digital data 1. But this encryption method requires that several dictionaries D1 to D3 be decrypted during the decryption method, and this may increase the system boot time.

It will also be possible, in another mode of implementation of the encryption method, to formulate a single dictionary D1 associated with a plurality of compressed digital data streams 5 to 7. In such a method a dictionary D1 is formulated on the basis of a first partition 9, and the said dictionary D1 is reused to compress the digital data of the other partitions 10 to 11. In this case the single dictionary D1 contains identifiers for all the various data contained in the partitions 9 to 11. By virtue of such a method, the data compression rate is decreased with the aid of a dictionary D1 which is suited to the digital data of the first partition 9, but which is less suited to the digital data of the other partitions 10 to 11. But this encryption method requires that a single dictionary D1 be decrypted during the decryption method, and this may considerably decrease the system boot time. It will be noted that if the compression rate is downgraded, a single dictionary D1 will occupy less memory space than a plurality of dictionaries D1 to D3.

Figure 2:
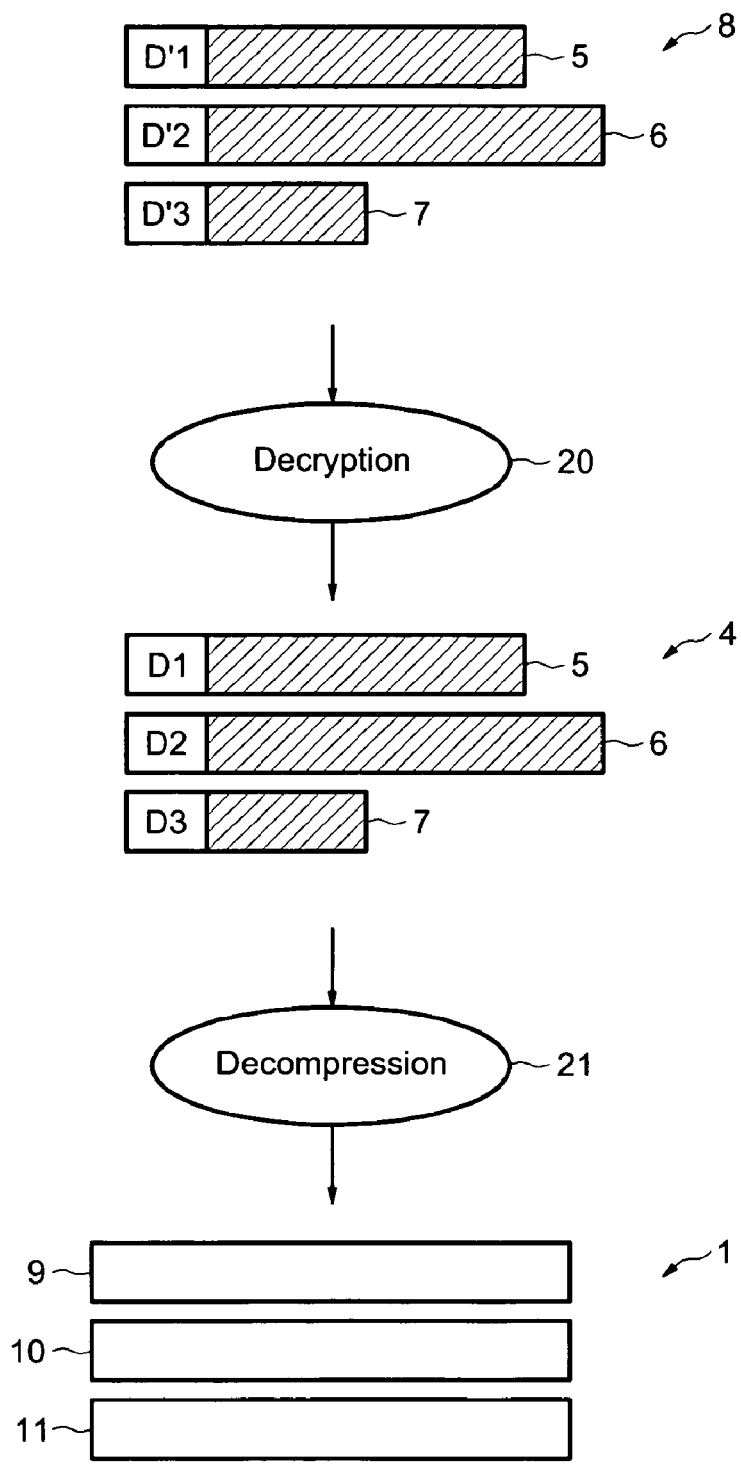
FIG. 2 represents a flowchart illustrating the main phases of a mode of implementation of the method for decrypting digital data.

In FIG. 2 are represented the main phases of a method for decrypting an encrypted digital data set 8.

This method comprises a decryption step 20 in which the encrypted digital data set 8 obtained by the method described in FIG. 1 is decrypted. During this decryption step 20, the encrypted dictionaries D'1 to D'3 are decrypted to obtain decrypted dictionaries D1 to D3. The decryption step 20 makes it possible, furthermore, to provide the compressed set 4 which comprises the said decrypted dictionaries D1 to D3 and the said compressed digital data streams 5 to 7.

After this decryption step 20, a decompression step 21 is performed, in which the compressed digital data streams 5 to 7 are decompressed with the aid of the decrypted dictionaries D1 to D3. During this decompression step, the initial digital data set is obtained.

During the decompression step 21, the content of the dictionaries D1 to D3 which describe respectively the contents of the compressed digital data streams 5 to 7 is traversed. It is thus possible to identify the list of identifiers and their respective links with the uncompressed data patterns contained in the said dictionaries 5 to 7. Next, each identifier stored in the compressed digital data 5 to 7 is replaced with the single coupled uncompressed data pattern. This decompression step 21 makes it possible to generate the initial decompressed digital data set 1.

Figure 3:
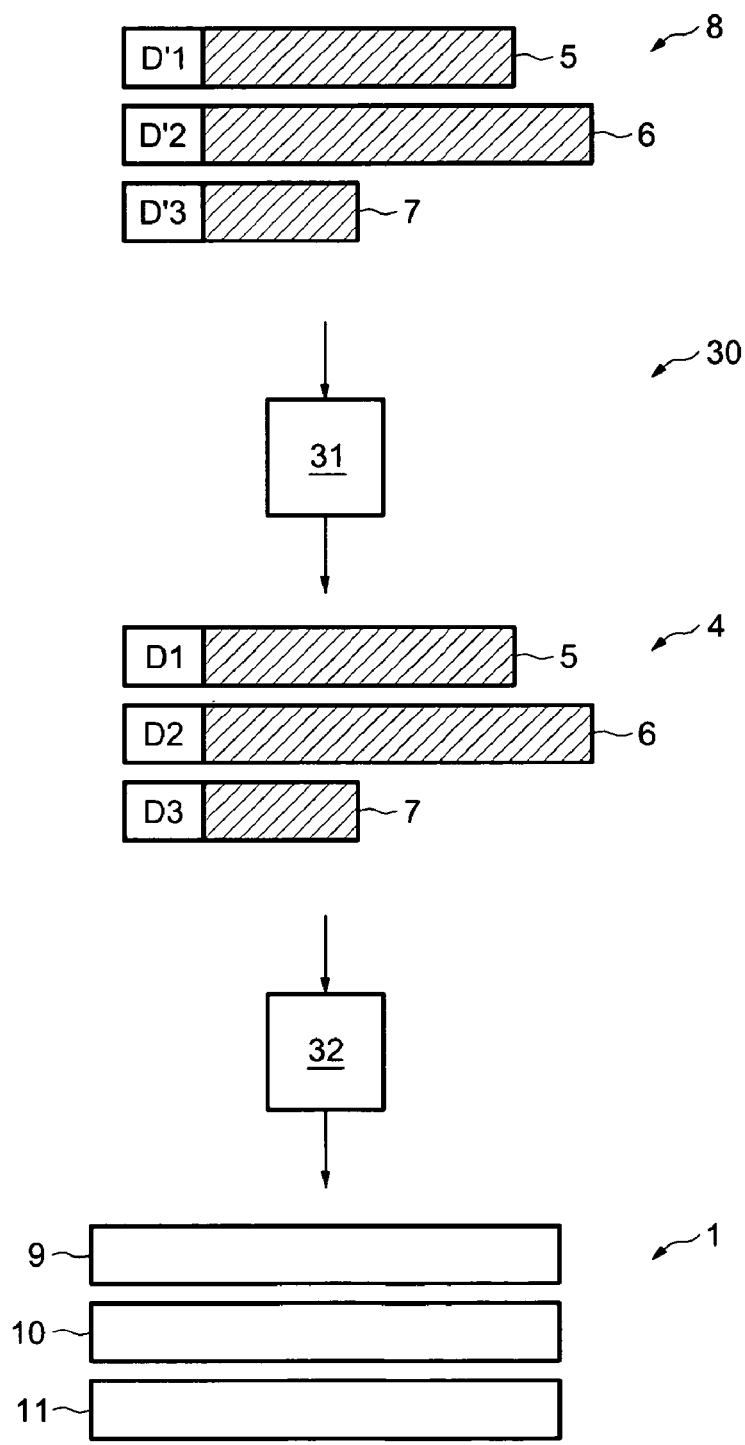
FIG. 3 illustrates in a schematic manner an embodiment of a device for decrypting digital data.

In FIG. 3 is schematically represented an embodiment of a decryption device 30 able to implement the method for decrypting the initial digital data set 1 described in FIG. 2. Certain references of FIG. 2 have been carried over to FIG. 3.

FIG. 3 therefore represents a decryption device 30 comprising a decryption means 31 and a decompression means 32. The decryption means 31 is able to decrypt the encrypted dictionaries D'1 to D'3 so as to deliver the compressed set 4. The decompression means 32 is able to decompress the compressed digital data streams 5 to 7 with the aid of the said dictionaries D'1 to D'3 so as to deliver the initial decompressed digital data set 1.

The decryption and decompression means can be for example embodied in a software manner within a microprocessor.

Figure 4:
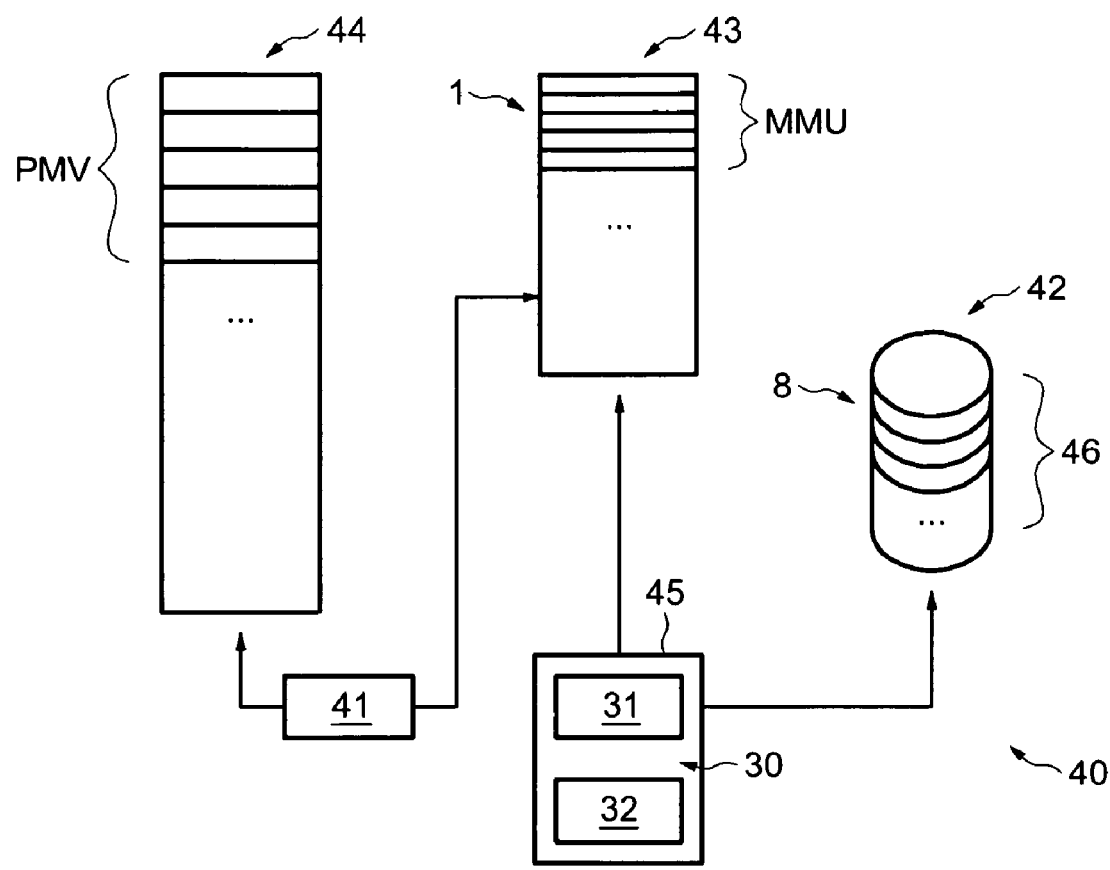
FIG. 4 illustrates in a schematic manner another embodiment of a device for decrypting digital data.

In FIG. 4 is schematically represented another embodiment of a digital data decryption device 30. In this embodiment, the decryption device 30 is incorporated into an electronic system 40 of the type comprising a virtual memory mechanism. The electronic system 40 comprises a processing unit 41, for example a microprocessor, a paginated storage memory 42, a paginated work memory 43, a paginated virtual memory 44 and a memory management unit 45.

The virtual memory technique is used in combination with the pagination mechanism, and these mechanisms are well known to the person skilled in the art.

The paginated storage memory 42 can be, for example, a hard disk or a flash memory and makes it possible to store an encrypted digital data set 8. This data set 8 is, furthermore, a set of paginated digital data able to be stored in memory pages 46 included in the said paginated storage memory 42.

The paginated work memory 43 can be, for example, a RAM memory, or Random Access Memory. This work memory 43 is able to store MMU pages accessible by the processing unit 41. The MMU pages make it possible to store paginated digital data originating, for example, from the paginated storage memory 42.

The virtual memory 44 also comprises PMV pages. The processing unit 41 issues memory addresses which are virtual addresses indicating the position of a word in the virtual memory. The virtual size of the virtual memory 44 is greater than the size of the work memory 43; this virtual memory 44 allows the processes to use virtual addresses whose quantity exceeds the capacity of the work memory 43.

An address translation mechanism makes it possible to translate a virtual address issued by the processing unit 41 into a physical address of the work memory 43.

The memory management unit 45 makes it possible to access the paginated storage memory 42 and the work memory 43; it is also able to transfer the content of memory pages 46 from the paginated storage memory 42 to the work memory 43. When the processing unit 41 executes processes, the latter use the work memory 43 to execute code parts which are stored in the MMU pages. The size of the work memory 43 being limited, a pagination mechanism is used which consists in freeing MMU pages chosen from the work memory 43, termed "victim pages", so as to free some memory space. It is the memory management unit 45 which chooses the victim pages. When a process again needs to allocate a memory page in order to execute a code part, the memory management unit transfers the content of the memory pages 46 which comprise the part of the code concerned from the paginated storage memory 42 to a free MMU page. The pagination mechanism intervenes when an exception called a "page defect" is generated and when a free MMU page is not available to satisfy the allocation of a memory page, either because there are no free MMU pages, or because the number of MMU pages free is less than a certain threshold.

The memory management unit 45 can contain the decryption device 30. Thus, when this unit 45 transfers the content of a memory page 46 containing encrypted digital data 8 from the paginated storage memory 42, the latter uses the decryption device 30 so as to transfer digital data usable by the processes into the MMU pages of the work memory 43.

The transfer of content of memory pages 46 consists in extracting the encrypted digital data set 8 from the memory pages 46 of the paginated storage memory 42. Next, the decryption means 31 decrypts the dictionary or dictionaries so as to deliver a compressed set 4 and the decompression means 32 decompresses the compressed digital data stream or streams 5 to 6 contained in the compressed set 4 so as to deliver the initial decompressed digital data set 1. Next, the memory management unit 45 stores this decompressed digital data set 1 in the free MMU pages of the work memory 43.

The encrypted digital data set 8 has been previously stored in the memory pages 46 of the paginated storage memory 42 according to the encryption method previously described in FIG. 1 for example.

Such a decryption device 30 is therefore well suited to an electronic system 40 which uses a pagination mechanism and/or virtual memory mechanism, since it makes it possible in particular to decrease the system boot time (decryption of the dictionaries on booting) and the pagination time (no decryption of compressed data streams).

Figure 5:
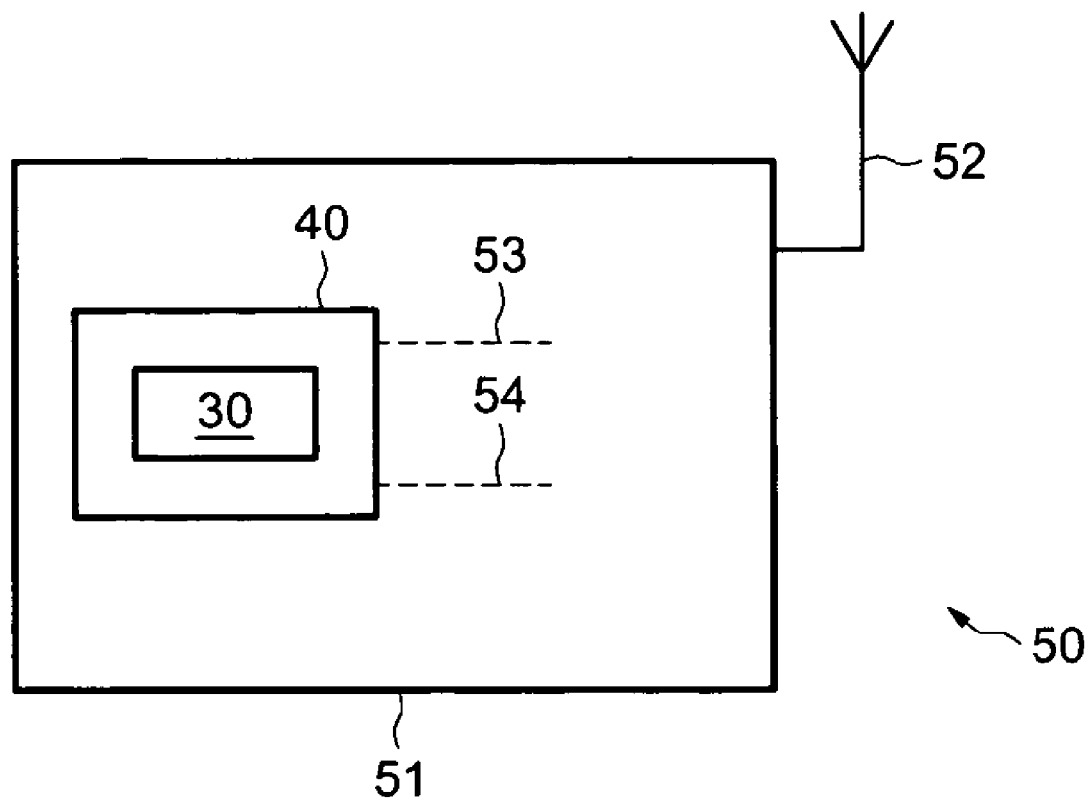
FIG. 5 illustrates in a schematic manner an embodiment of a wireless communication apparatus comprising a decryption device.

In FIG. 5 is represented in a schematic manner a wireless communication apparatus 50 comprising a decryption device 30 as described in FIG. 3. The apparatus 50 comprises a housing 51 and an antenna 52 for sending/receiving digital data. Furthermore, the housing 51 comprises a digital data transmission chain 53 and a digital data reception chain 54. The said chains 54 and 55 are coupled to the electronic system 40 previously described in FIG. 4, the said electronic system 40 comprising the said decryption device 30. A wireless communication apparatus such as this can be, for example, a cellular telephone.

The invention claimed is:

1. A method for encrypting an initial digital data set, wherein it comprises a compression of the initial digital data set delivering a compressed set comprising at least one compressed digital data stream and at least one dictionary associated with the at least one compressed digital data stream, and an encryption of the at least one dictionary only, delivering an encrypted digital data set comprising said at least one compressed digital data stream and the at least one encrypted dictionary.

2. The encryption method according to claim 1, in which the compressed set comprises a dictionary associated with several compressed digital data streams, or several dictionaries respectively associated with several compressed digital data streams.

3. The encryption method according to claim 1, in which the initial digital data set is a paginated data set and the encrypted digital data set is stored, furthermore, in a paginated storage memory of an electronic system, for example a wireless communication apparatus.

4. A method for decrypting a digital data set encrypted by the encryption method according to claim 1, on the basis of an initial digital data set, comprising a decryption of the at least one encrypted dictionary and a decompression of the at least one compressed digital data stream with the aid of the at least one decrypted dictionary so as to obtain the initial digital data set.

5. The decryption method according to claim 4, comprising a storage of the encrypted digital data set in a paginated storage memory of an electronic system and a decryption of the dictionary during the booting of the electronic system.

6. The decryption method according to claim 5, in which the electronic system comprises a virtual memory mechanism comprising a paginated work memory, the content of memory pages is transferred from the paginated storage memory to the paginated work memory and the encrypted digital data set contained in the memory pages is decompressed during the transfers of memory pages.

7. The decryption method according to claim 4, implemented in a wireless communication apparatus.

8. A device for decrypting a digital data set encrypted on the basis of an initial digital data set, wherein the encrypted digital data set comprises at least one unencrypted compressed digital data stream and at least one encrypted dictionary associated with the at least one unencrypted compressed digital data stream and in that it comprises a decryption means able to decrypt the at least one dictionary and a decompression means able to decompress the at least one unencrypted compressed digital data stream with the aid of the at least one decrypted dictionary so as to obtain the initial digital data set.

9. The decryption device according to claim 8, in which a paginated storage memory of an electronic system contains the encrypted digital data set and the decryption means is able to decrypt the dictionary during the booting of the electronic system.

10. The decryption device according to claim 9, in which the electronic system comprises a virtual memory mechanism comprising a paginated work memory and a memory management unit which is able to transfer the content of memory pages from the paginated storage memory to the paginated work memory and in which the decompression means is able to decompress the encrypted digital data set contained in the memory pages during the transfers of the memory pages.

11. A wireless communication apparatus comprising a decryption device according to claim 8.

* * * * *